United States Patent
Noichi

(10) Patent No.: US 8,026,533 B2
(45) Date of Patent: Sep. 27, 2011

(54) LIGHT EMITTING DEVICE AND METHOD OF MANUFACTURING THE SAME

(75) Inventor: Takuya Noichi, Kaifu-gun (JP)

(73) Assignee: Nichia Corporation, Tokushima (JP)

( * ) Notice: Subject to any disclaimer, the term of this patent is extended or adjusted under 35 U.S.C. 154(b) by 180 days.

(21) Appl. No.: 12/167,673

(22) Filed: Jul. 3, 2008

(65) Prior Publication Data

US 2009/0020778 A1 Jan. 22, 2009

(30) Foreign Application Priority Data

Jul. 19, 2007 (JP) ................................. 2007-188709
Dec. 27, 2007 (JP) ................................. 2007-335793

(51) Int. Cl.
*H01L 33/00* (2010.01)
*H01L 21/00* (2006.01)

(52) U.S. Cl. .................. 257/99; 257/100; 257/E33.058; 257/E31.117; 257/E21.499; 438/26; 438/27

(58) Field of Classification Search .................. 257/443, 257/99, E33.057, 100, 684, 687, E33.056–E33.059, 257/E31.117, E21.499; 438/26, 39, 42, FOR. 157, 438/FOR. 416, FOR. 453, 27, 123–127, FOR. 417
See application file for complete search history.

(56) References Cited

U.S. PATENT DOCUMENTS

| | | | |
|---|---|---|---|
| 2002/0011601 A1* | 1/2002 | Furukawa et al. | 257/98 |
| 2004/0240773 A1 | 12/2004 | Kobinata et al. | |
| 2009/0090926 A1* | 4/2009 | Wang et al. | 257/99 |

FOREIGN PATENT DOCUMENTS

| | | |
|---|---|---|
| JP | 11-54804 | 2/1999 |
| JP | 11-112036 | 4/1999 |
| JP | 2004-363185 | 12/2004 |
| JP | 2007-150229 | 6/2007 |

* cited by examiner

*Primary Examiner* — Matthew Smith
*Assistant Examiner* — Quovaunda Jefferson
(74) *Attorney, Agent, or Firm* — Ditthavong Mori & Steiner, P.C.

(57) ABSTRACT

The light emitting device 100 includes a light emitting element 101, a package for arranging the light emitting element 101, and an electrically conductive wire 106 for connecting an electrode disposed on the package and an electrode of the light emitting element. The package includes a support member 108 having a mounting portion to arrange the light emitting element 101 and defining a recess 103 to house a semiconductor element 102 which is different than the light emitting element, and a light transmissive member 107 covering at least the light emitting element 101. The package defines a hollow portion 111 between the light transmissive member 107 covering the opening of the recess 103 and an inner wall defining the recess 103.

11 Claims, 3 Drawing Sheets

LIGHT EMITTING DEVICE AND METHOD OF MANUFACTURING THE SAME

BACKGROUND OF THE INVENTION

1. Field of the Invention

The present invention relates to a light emitting device that can be used as illumination apparatus, display, backlight for cell-phone, auxiliary light source for moving image illumination, and other light source and a method of manufacturing the same.

2. Description of the Related Art

Light emitting devices using light emitting element such as light emitting diodes are small in size and have good power efficiency, and can emit light of a bright color. Also, differing from such as electric light bulbs, such light emitting elements are free from burn out and the like. Further, they are excellent in initial drive performance and have excellent durability for vibrations and/or repeated ON/OFF operations. Owing to such excellent properties, light emitting devices using light emitting element such as light emitting diode (LED), laser diode (LD) and the like are utilized as light sources for illumination apparatus, back light for cell phone, and the like.

A protective element such as Zener diode may be mounted in such light emitting devices to protect the light emitting element from a damage caused by overvoltage. Such a protective element is disposed adjacent to a light emitting element on a supporting substrate where the light emitting element has been mounted, and is electrically connected to the light emitting element.

For example, the light emitting device disclosed in JP H11-54804A includes an insulating substrate having a first electrode and a second electrode of different polarity, an LED chip disposed on the upper surface side of the first electrode, a protective element (e.g., Zener diode) disposed on the second electrode, and a sealing resin covering the LED chip and an electrically conductive wire connected to the LED chip. Further, one electrode of the LED chip is connected to the first electrode and the other electrode of the LED is connected to the second electrode via a wire, respectively. On the other hand, the electrode of the upper surface side of the protective element is connected to the first electrode via an electrically conductive wire and the electrode of the lower surface of the protective element is connected to the second electrode via an electrically conductive adhesive.

In such case, a part of light from the light emitting element may be absorbed by the protective element and/or be intercepted by the protective element. Thus, the overall light extraction efficiency of the light emitting device may be decreased. Therefore, when a recess is formed under the protective element so that the height of the protective element is lower than that of the light emitting element, and the protective element is disposed in the recess, interception of light by the protective element can be decreased.

Alternatively, interception of the path of the light from the light emitting element to be extracted out of the light emitting device can also be prevented by disposing a reflecting member between the light emitting element and the protective element, other than the light transmissive member covering the light emitting element so as to reflect the light from the light emitting element toward out of the light emitting device, as described in JP 2007-150229A. In view of workability and the like in a case where a plurality of semiconductor light emitting elements are mounted on a supporting substrate, the recess for housing the protective element is preferably formed in the supporting substrate so that the opening of the recess is situated in the same plane as the plane where the light emitting elements to be mounted.

However, if the protective element is mounted in the recess formed lower than the mounting surface of the light emitting element, a part of light emitted from the end surface of the light emitting element which is located above is confined within the recess. As a result, light extraction efficiency of the light emitting device is decreased. Further, when the body color of the protective element is such that it absorbs the light from the light emitting element, the confined light is absorbed by the protective element and the output of the light emitting device is significantly reduced. Also, it is not practical that when the recess which houses the protective element is encapsulated with a reflective filler to prevent the light from entering the recess, additional time and material cost are required.

It is therefore an object of the present invention is to provide a light emitting device having excellent reliability and optical properties and to provide a method of manufacturing such light emitting device at a lower cost.

SUMMARY OF THE INVENTION

In order to achieve the above objects, a light emitting device of the present invention includes a light emitting element, a package for arranging the light emitting element, and an electrically conductive wire for connecting an electrode disposed on the package and an electrode of the light emitting element. The package includes a support member having a mounting portion to arrange the light emitting element and defining a recess to house a semiconductor element which is different than the light emitting element, and a light transmissive member disposed on the support member. The light transmissive member at least covers the light emitting element and the opening of the recess, and a hollow portion is retained in the recess formed in the package. The hollow portion is preferably defined between the bottom surface of the light transmissive member covering the opening and the upper surface of the semiconductor element housed in the recess.

A method of manufacturing a light emitting device having a light emitting element, a package for arranging the light emitting element, and an electrically conductive wire for connecting an electrode disposed on the package and an electrode of the light emitting element, the package including a support member having a mounting portion to arrange the light emitting element and defining a recess to house a semiconductor element which is different than the light emitting element, and a light transmissive member disposed on the support member, the light transmissive member at least covering the light emitting element and the opening of the recess, and a hollow portion being retained in the recess formed in the package, the method includes a first step of forming a support member defining a recess which opens to an upper surface of the support member where the light emitting element to be mounted, a second step of housing the semiconductor element such that the upper surface of the semiconductor element is lower than the mounting portion of the light emitting element, a third step of arranging the light emitting element and the electrically conductive wire, and a fourth step of disposing a light transmissive member on the support member so as to cover at least the light emitting element and the opening of the recess while defining a hollow portion in the recess.

The above and further objects of the present invention as well as the features thereof will become more apparent from the following detailed description to be made in conjunction with the accompanying drawings.

DETAILED DESCRIPTION OF THE PREFERRED EMBODIMENT(S)

Figure 1:
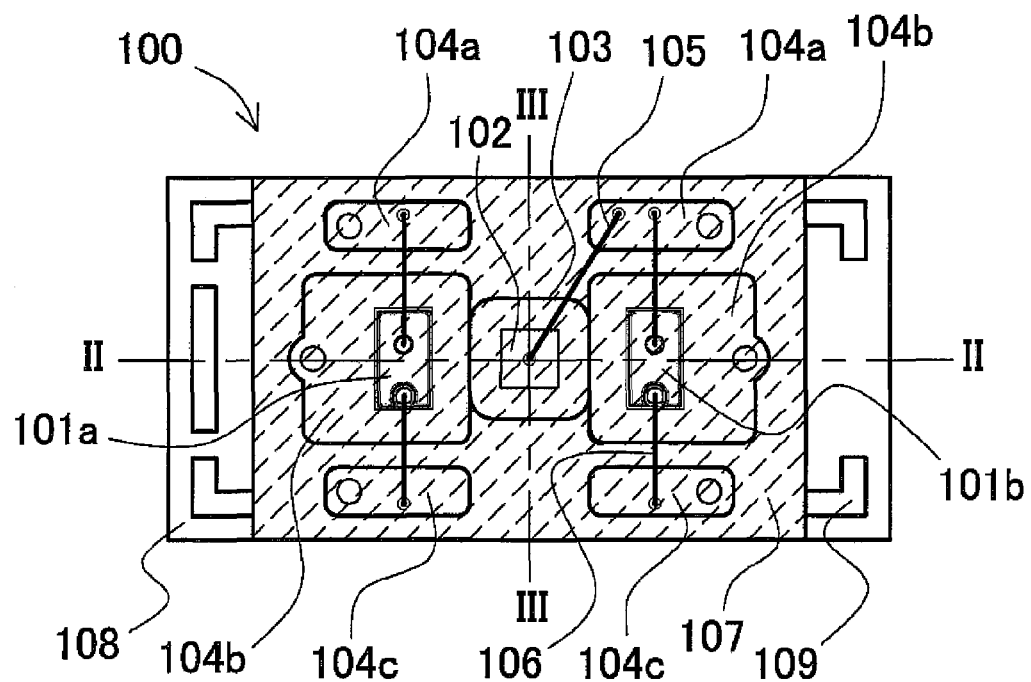
FIG. 1 is a schematic top view of a light emitting device according to an embodiment of the present invention.

In a light emitting device of the present embodiment, a protective element is disposed on the bottom surface of a recess formed in the lower surface than the mounting surface of a light emitting element, and a hollow portion is defined in the recess housing the protective element. In this arrangement, difference in refractive index occurs between the light transmissive member covering the light emitting element and the hollow portion. Thus, the light emitted from the light emitting element and the light from a fluorescent material are reflected at the interface between such media of different refractive index, and extracted out of the light emitting device. That is, the present invention utilizes the hollow portion provided in the recess, so that light extraction efficiency can be improved compared to conventional devices. Further, the lights can be extracted from the light emitting device without being lost at the recess, so that unevenness in distribution of light and chromaticity can be reduced.

In the light emitting device of the present embodiment, light is prevented from entering the recess by providing the hollow portion, which is formed by disposing the light transmissive member on the support member, in the recess in which the protective element is housed. With this arrangement, the present invention provides a light emitting device exhibiting smaller light loss at the recess which houses the protective element, and having a relatively simple structure and being inexpensive, compared with such light emitting devices in which a light reflective filling is applied in the recess, or another reflective material other than the light transmissive member covering the light emitting element is provided between the light emitting element and the protective element.

According to a method of manufacturing a light emitting device of the present embodiment, it is possible to fabricate a light emitting device exhibiting smaller light loss at the recess which houses the protective element relatively simply and at a low cost, compared with such light emitting devices in which a light reflective filling is applied in the recess, or another reflective material other than the light transmissive member covering the light emitting element is provided between the light emitting element and the protective element. Moreover, a method of manufacturing a light emitting device of the present invention includes a step in which a light transmissive member covering a light emitting element is provided on the support member, and therefore, at the same time an air bubble can be retained in the recess, in which the bottom surface defining the recess locates lower than the mounting surface of the light emitting element. Accordingly, a light emitting device exhibiting smaller light loss at the recess can be manufactured relatively simply and at a lower cost, The hollow portion defined in the recess of the package of the light emitting device is preferably provided between the bottom surface of the light transmissive member covering the opening and the upper surface of the light emitting element housed in the recess.

In addition, the light transmissive member preferably has a convex protrusion extending from the opening of the recess toward the bottom surface defining the recess.

Further, it is preferable that the recess is formed in a region between a plurality of mounting portions for the light emitting elements, and the support member has an electrode for external connection approximately directly below each of the mounting portions.

Further, the outline shape of the opening of the recess in plan view and the outline shape of the semiconductor element housed in the recess in plan view, which are of substantially similar shape, are preferably in a ratio of 1.0 to 2.5.

Further, the fourth step preferably includes a step of continuously supplying material of the light transmissive member in substantially parallel direction to the mounting surface of the light emitting element.

Further, it is preferable that, in the fourth step, the viscosity of the material of the light transmissive member is preferably adjusted based on the size of the recess with respect to the size of the semiconductor element so that an air bubble can be retained in the recess.

Further, it is preferable that the material of the light transmissive member contains at least one resin selected from silicone resin or epoxy resin, and the resin contains a particulate fluorescent material.

Further, it is preferable that the viscosity of the light transmissive member is in a range from 200 Pa·s to 500 Pa·s.

Further, it is preferable that the outline shape of the opening of the recess in plan view and the outline shape of the semiconductor housed in the recess in plan view, which are of substantially similar shape, are in a ratio of 1.0 to 2.5, and the depth of the recess and the height of the semiconductor element housed in the recess are in a ratio of 1.0 to 2.14.

The inventor conducted various experiments in order to reduce the loss of light at the recess in a device including a light emitting element, a package for arranging the light emitting element, and an electrically conductive wire for connecting an electrode disposed on the package and an electrode of the light emitting element. The package includes a support member having a mounting portion to arrange the light emitting element and defining a recess to house a semiconductor element which is different than the light emitting element, and a light transmissive member covering at least the light emitting element. As a result, the inventor has succeeded at solving the above problems by fabricating a package in which the opening of the recess housing the semiconductor element different than the light emitting element is covered by a part of the light transmissive member covering the light emitting element, and a hollow portion is defined in the recess. According to the present invention, a hollow portion is defined in the recess, so that difference in refractive index occurs between the light transmissive member covering the light emitting element and the hollow portion. Light is reflected at the interface between such media of different refractive index, and emitted out of the light emitting device. Thus, according to the present invention, light loss at the recess is substantially eliminated, so that light extraction efficiency of the light emitting device can be improved compared with conventional technology.

Further, the hollow portion in the package of the light emitting device is preferably defined between the bottom surface of the light transmissive member covering the opening of the recess and the upper surface of the semiconductor element housed in the recess. This is because the light propagating in the light transmissive member can be prevented from being absorbed by the light emitting element housed in the recess.

It is preferable that the light transmissive member has a protrusion at the opening of the recess and the protrusion has a convex bottom surface extending toward the bottom surface of the recess. This is because with such a protrusion, light can be prevented from entering the recess and the effect to reflect light toward the light transmissive member on the upper aspect of the support member can be increased. It is preferable to provide a hollow portion between the bottom surfaces of the light transmissive member and its protrusion and the upper surface of the semiconductor element housed in the recess. Light external to the recess can be prevented from reaching the semiconductor element due to the spacing of the hollow portion provided between the bottom surface of the light transmissive member and the upper surface of the semiconductor element, so that light loss by the semiconductor element housed in the recess can be avoided.

The outline shape of the opening of the recess in plan view and the outline shape of the semiconductor housed in the recess in plan view, which are of substantially similar shape, are preferably in a ratio of 1.0 to 2.5. This is because if the opening of the recess is too large relative to the size of the semiconductor element, the amount of light entering the recess increases. Also, if the opening of the recess is too small relative to the size of the semiconductor element, workability in disposing the semiconductor element in the recess decreases, so that a light emitting device having good mass productivity cannot be obtained.

The inventor conducted various experiments in order to manufacture a light emitting device exhibiting smaller light loss at the recess relatively simply and at a low cost. The device includes a light emitting element, a package for arranging the light emitting element, and an electrically conductive wire for connecting an electrode disposed on the package and an electrode of the light emitting element. The package includes a support member having a mounting portion to arrange the light emitting element and defining a recess to house a semiconductor element which is different than the light emitting element, and a light transmissive member disposed on the support member. The light transmissive member at least covers the light emitting element and the opening of the recess, and a hollow portion is retained in the recess formed in the package. As a result, the inventor has succeeded in achieving the above object, a method of manufacturing a light emitting device having a light emitting element, a package for arranging the light emitting element, and an electrically conductive wire for connecting an electrode disposed on the package and an electrode of the light emitting element, the package including a support member having a mounting portion to arrange the light emitting element and defining a recess to house a semiconductor element which is different than the light emitting element, and a light transmissive member disposed on the support member, the light transmissive member at least covering the light emitting element and the opening of the recess, and a hollow portion being retained in the recess formed in the package, includes a first step of forming a support member defining a recess which opens to an upper surface where the light emitting element to be mounted, a second step of housing the semiconductor element such that the upper surface of the semiconductor element is lower than the mounting portion of the light emitting element, a third step of arranging the light emitting element and the electrically conductive wire, and a fourth step of disposing a light transmissive member on the support member so as to cover at least the light emitting element and the opening the recess while defining a hollow portion in the recess. That is, the method of manufacturing a light emitting device does not require a step of filling a reflective filler in the recess housing a semiconductor element, so that a light emitting device exhibiting smaller light loss at the recess can be manufactured relatively simply and at a low cost.

In the method of manufacturing the light emitting device, disposing the light transmissive member to the support member and defining the hollow portion are performed in the same step, thus simplifies the step in manufacturing the light emitting device. When such a method is employed, the fourth step of disposing a light transmissive member includes a step of continuously supplying a material of the light transmissive member in substantially parallel direction to the mounting surface of the light emitting element. That is, the fluid material of the light transmissive member is poured in a direction substantially parallel to the mounting surface where the light emitting element is disposed, then the material is cured in a die to form the light transmissive member. Here, the term "substantially parallel" means a tolerable range of about 10 degrees deviation with respect to a parallel plane to the mounting surface of the light emitting element is included.

The viscosity of the material of the light transmissive member is adjusted according to the sizes of the semiconductor element to be housed and the recess so that the hollow portion, results from a residual air bubble, can be obtained in the fourth step. For example, the size and depth of the recess are preferably such that the outline shape of the opening of the recess in plan view and the outline shape of the semiconductor element housed in the recess in plan view, which are of substantially similar shape, are in a ratio of 1.0 to 2.5, and that the depth D of the recess and the height H of the semiconductor element housed in the recess are in a ratio (D/H) of 1.0 to 2.14. This is to minimize the size of the air bubble so that it does not lead a reliability problem of the light emitting device.

Further, the viscosity of the material of the light transmissive member is preferably in a range from 200 Pa·s to 500 Pa·s. If the viscosity is lower than the above range, the recess housing the semiconductor element is filled with the material of the light transmissive member without forming the hollow portion. On the other hand, if the viscosity is higher than the above range, the workability in the step of disposing the material of the light transmissive member decreases.

It is also possible to provide a light emitting device having a convex protrusion of the light transmissive member protruding from the opening of the recess toward the bottom surface defining the recess, by adjusting the viscosity of the material of the light transmissive member, so that a hollow portion can be defined between the convex bottom surface of the protruded portion of the light transmissive member and the upper surface of the semiconductor element.

It is preferable that the material of the light transmissive member contains at least one resin selected from silicone resin or epoxy resin, and the resin contains a particulate fluorescent material. This is because the viscosity of the resin containing the particulate fluorescent material can be easily adjusted by adjusting the content rate of the particulate fluorescent material which is to be contained in the resin, so that the hollow portion can be easily provided in the light emitting device having a light transmissive member containing a fluorescent member.

Figure 2:
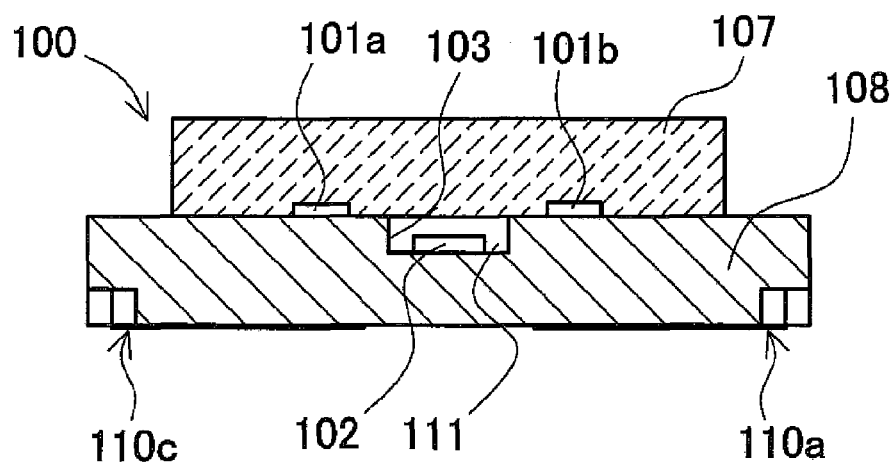
FIG. 2 is a schematic cross-sectional view taken along line II-II of FIG. 1.
Figure 3:
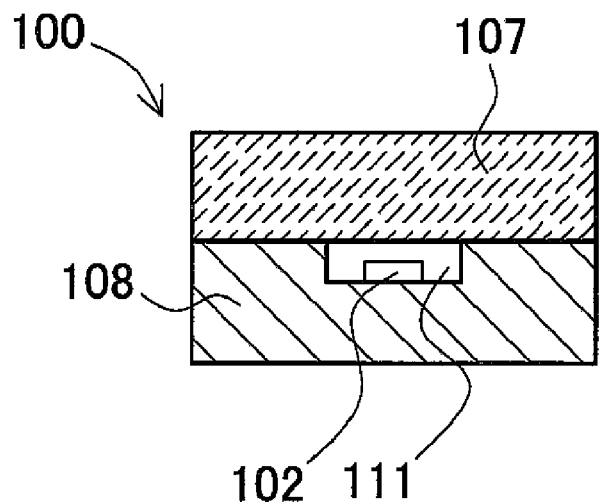
FIG. 3 is a schematic cross-sectional view taken along line III-III of FIG. 1.
Figure 4:
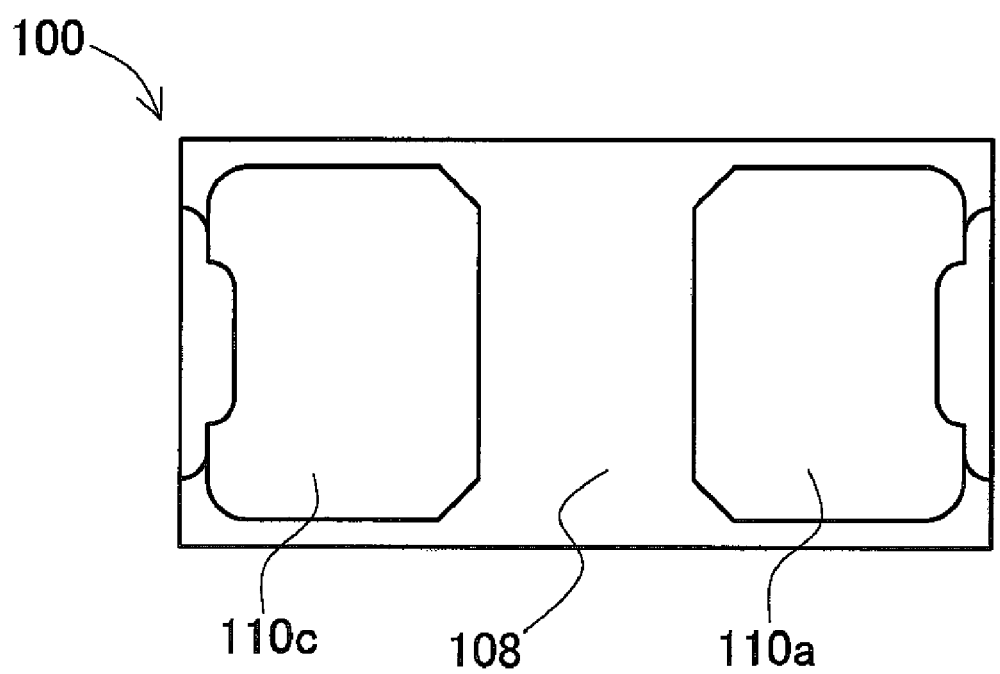
FIG. 4 is a schematic bottom plan view of a light emitting device according to an example of the present invention.
Figure 5:
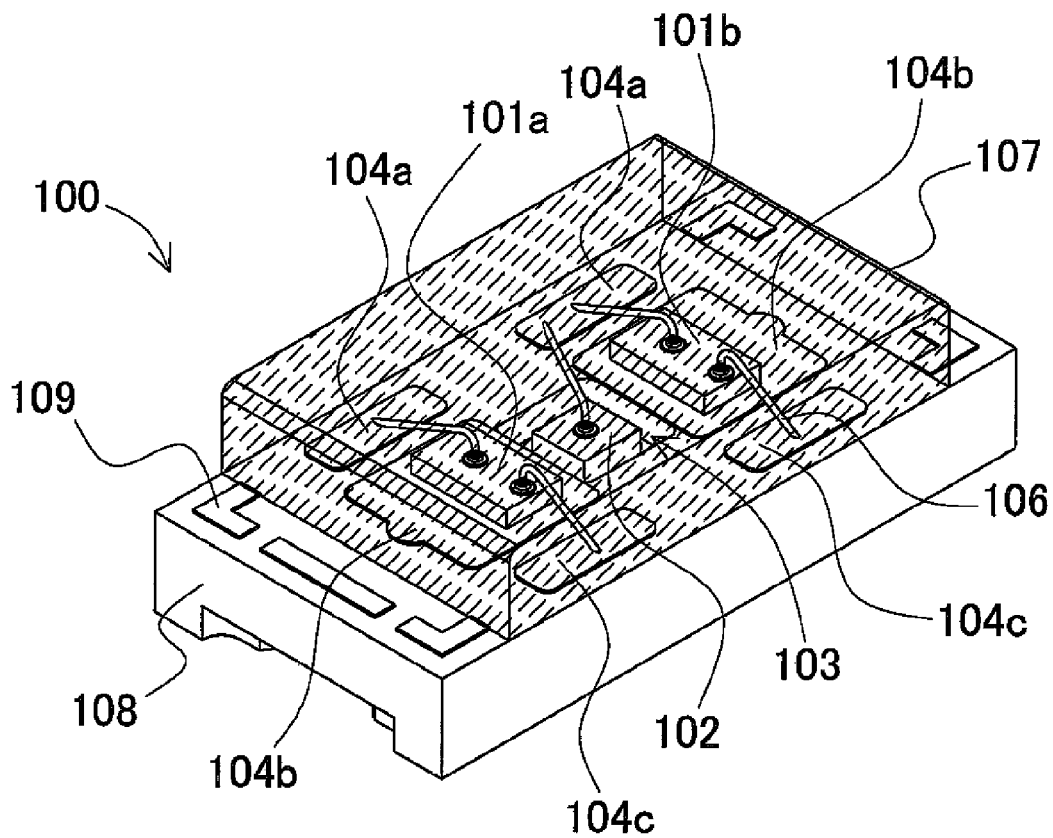
FIG. 5 is a schematic perspective view of a light emitting device according to an example of the present invention.
Figure 6:
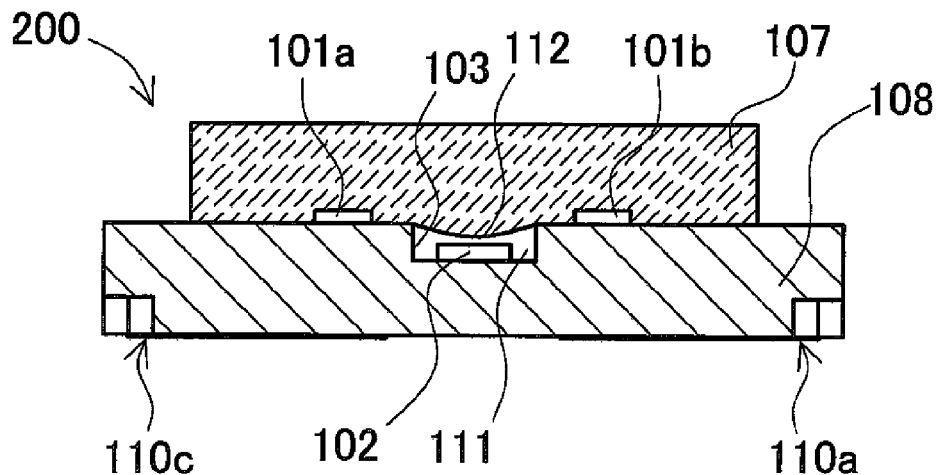
FIG. 6 is a schematic cross-sectional view of a light emitting device according to another example of the present invention.

In the following, preferred embodiments of the present invention will be described in reference to the accompanying drawings. FIG. 1 is a schematic top view of a light emitting device 100 according to the present embodiment. FIG. 2 is a schematic cross-sectional view taken along line II-II of FIG. 1, and FIG. 3 is a schematic cross-sectional view taken along line III-III of FIG. 1. FIG. 4 is a schematic bottom plan view of a light emitting device 100 according to the present embodiment. FIG. 5 is a schematic perspective view of a light emitting device 100 according to the present embodiment. FIG. 6 is a schematic cross-sectional view of a light emitting device 200 which is different than the light emitting device 100 of the present embodiment, showing the cross-section corresponding to that of the light emitting device 100 in FIG. 2.

As shown in FIG. 1, the light emitting device 100 of the present embodiment includes as its main components, two light emitting elements 101a, 101b, a support member 108 for arranging the light emitting elements, a semiconductor element 102 which is different from the light emitting elements and mounted on the same support member as the light emitting elements, a first electrically conductive wire 105 connecting the electrode of the semiconductor element to the electrode of the support member, and second electrically conductive wires 106 each connecting each electrode of each light emitting element with corresponding electrode of the support member respectively.

In the present embodiment, the semiconductor element 102 mounted on the support member separately from the light emitting elements is a protective element (for example, a Zener diode), to protect the light emitting elements from overvoltage. The support member defines a recess 103 depressed from the upper surface side on which the light emitting elements 101a, 101b are arranged toward the bottom surface side, and the protective element is housed in the recess 103.

Further, as shown in FIGS. 2, 3, and 5, the light transmissive member 107 is disposed on the upper surface of the support member 108 so as to close the opening of the recess 103. The light transmissive member 107 covers at least the light emitting elements 101a, 101b arranged at the upper surface side and the second electrically conductive wires 106 connecting thereto respectively. In this arrangement, a hollow portion is provided in the recess 103 between the light transmissive member disposed on the upper surface of the support member 108 and the inner wall defining the recess. Here, the term "hollow portion" in the present specification means such as an air bubble occurred within the light transmissive member 107 or between the light transmissive member 107 and the support member, and containing air or other gas, or a gap occurred between the lower surface of the light transmissive member 107 and the recess. Such a hollow portion is provided outside of the semiconductor element disposed in the recess, particularly above the semiconductor element, that is, towards the direction where light propagates from outside of the opening. The shape and number of the hollow portion is not limited. For example, a plurality of spherical hollow portions may be scattered in the recess. Similar effect obtained by including a diffusing agent in the light transmissive member can be obtained by arranging the hollow portions scattered. That is, light is diffused in the light transmissive member and prevented from entering the recess in the direction toward the bottom surface. The location of the hollow portion is not limited to the location between the bottom surface of the light transmissive member at the opening and the upper surface of the semiconductor element. The hollow portion needed to be provided between the light transmissive member covering the opening of the recess and the inner wall defining the recess. For example, the hollow portion may be provided between the side surfaces of the semiconductor element housed in the recess and the inner wall defining the recess.

As shown in FIG. 2 and FIG. 3, the light emitting device 100 in the present embodiment includes a hollow portion 111 defined by the lower surface of the light transmissive member 107 covering the opening of the recess 103, the upper surface of the semiconductor element 102, and the inner wall defining the recess 103. Light incident to the interface between the hollow portion 111 provided in the opening of the recess 103 and the light transmissive member 107 can be reflected to the light transmissive member 107 side at the interface. Therefore, the light emitting device 100 of the present embodiment is able to extract light out of the light emitting device without light entering the recess 103.

Such a hollow portion 111 can be formed simultaneously in a step of disposing the light transmissive member 107 on the support member 108. For example, after arranging a screen or mask on the upper surface of the support member 108, the material of the light transmissive member 107 is printed to form the hollow portion. In this method, the material is continuously supplied in substantially parallel direction on the upper surface of the support member and then each member disposed on the upper surface of the support member 108 is covered. Therefore, it is necessary to dispose the material of the light transmissive member 107 while forming the hollow portion 111 in the recess 103, without completely filling the recess 103 with the material of the light transmissive member 107. The material of the light transmissive member 107 of the present embodiment is prepared with a certain viscosity in view of the size of the opening of the recess 103 and workability in disposing the material and the like. For example, in order to obtain a light emitting device which has a light transmissive member containing a fluorescent material, a YAG-system fluorescent is used as the fluorescent material and a silicone resin is used as the light transmissive member, and a mixture thereof is made. The viscosity of the material is then adjusted to a range from 200 Pa·s to 500 Pa·s with using a B-type viscometer (a Brookfield Viscometer).

The method of manufacturing according to the present embodiment utilizes the fact that when the material of the light transmissive member is disposed on the upper surface of the support member, a hollow portion resulted from a residual air bubble is easily formed in the recess formed lower than the upper surface of the support member where a light emitting element is mounted. That is, a protective element is housed in the recess and an air bubble is kept around the protective element to form a hollow portion. Thus, according to the method of manufacturing a light emitting device of the present embodiment, a step of disposing the material of the light transmissive member covering the light emitting element on the upper surface of the support member and a step of forming a hollow portion resulted from a residual air bubble in the recess defined by a bottom surface lower than the mounting surface of the light emitting element can be combined. Compared with a light emitting device in which the recess housing a protective element is filled with a reflective filler, the light emitting device of the present embodiment with higher light extraction efficiency can be manufactured relatively simply at a lower cost.

As shown in FIG. 6, the light emitting device of the present invention may have a protrusion 112 of the light transmissive member 107 in the opening of the recess 103. The protrusion 112 is a part of the light transmissive member 107 and has a convex surface protruding toward the bottom surface defining the recess. Further, the light emitting device of the present embodiment may have a hollow portion 111 between the convex bottom surface of the protrusion 112 and the upper surface of the semiconductor element 102 housed in the recess. Such a protrusion 112 of the light transmissive member can be shaped by using the fluidity of the light transmissive member which has a certain degree of viscosity, then cured. That is, after adjusting the viscosity of the material of the light transmissive member, the fluid material is convexly extended from the opening of the recess toward the bottom surface defining the recess so as to obtain a desired shape, and then cured. The degree of extension in the direction toward the bottom surface defining the recess can be adjusted also by adjusting the viscosity of the material of the light transmissive member. With this arrangement, a hollow portion can be formed between the bottom surface of the convex protrusion and the upper surface of the semiconductor element housed in the recess, or the size of the protrusion can be adjusted.

The hollow portion 111 of the present embodiment may also be formed by disposing the light transmissive member 107 previously prepared in a preceding step on the upper surface of the support member 108 and the opening of the recess in which the semiconductor element is disposed is closed by a part of the light transmissive member 107. That is, with this arrangement, the hollow portion is defined between the bottom surface of the light transmissive member 107, which is a part of the light transmissive member 107 disposed on the support member 108 so as to cover the light emitting element, closing the opening of the recess 103 and the recess 103. Thus, light is reflected at the bottom surface of the light transmissive member and can be extracted out of the device. Also, in view of improvement in view of productivity, it is preferable to employ a method of manufacturing in which the hollow portion is provided simultaneously with the light transmissive member covering the light emitting element and the electrically conductive wires.

In the present specification, the term "upper surface" of each member refers to any external surfaces of the support member on the side where the light emitting element to be mounted, and the term "bottom surface" refers to a surface opposite to the upper surface. In addition, a surface connecting the upper surface and the bottom surface is referred to a "side surface".

The light emitting device 100 of the present embodiment includes a pair of positive and negative electrodes 110a, 110c for external connection. When the light emitting device 100 is soldered to a wiring substrate (not shown), the electrodes for external connection 110a, and 110c are connected to the electrodes of the wiring substrate respectively through the solder. In this step, the electrodes 110a, 110c for external connection may also be made as a heat dissipation path from the support member toward the wiring substrate via the solder.

In this case, if the mounting position of the light emitting element is arranged substantially directly over the electrodes for external connection disposed on the bottom surface side of the support member, the heat dissipation path can be shortened, so that the heat dissipation performance of the light emitting device can be improved. Further, as in the light emitting device 100 of the present embodiment, in a case where a plurality of mounting portions of light emitting elements 101a, 101b are arranged on the support member 108, the support member 108 is preferably formed such that an opening of a recess for housing a semiconductor element which is different than the light emitting element is defined in a region between a plurality of mounting portions 104b for disposing a plurality of light emitting elements respectively in top view. Further, a pair of positive and negative electrodes 110a, 110c for external connection of the light emitting device 100 are preferably extended directly beneath each mounting portion of the light emitting element 101a, 101b. That is, electrodes 110a, 110c for external connection disposed on the back surface of the support member 108 of the light emitting device 100 is such that it preferably include at least a part of, and more preferably include entire part of, the perspective shape obtained by vertically projecting the outline of the arranging pattern of the mounting portions 104b from the upper surface 108 (shown in FIG. 1) to the bottom surface (shown in FIG. 4) of the support member 108.

For example, as shown in FIG. 4, in the light emitting device of the present embodiment, a pair of positive and negative electrodes 110a, 110c for external connection disposed on the bottom surface of the support member are extended from each end of the support member 108 to directly under the mounting portions 104b of the light emitting elements 101a, 101b. According to such disposition arrangement of the electrodes for external connection and the mounting portions of the light emitting elements, heat dissipation from the mounting portions of the light emitting elements to the wiring substrate through the electrodes for external connection can be performed without being hindered by the recess or the hollow portion provided in the recess. Therefore, deterioration in heat dissipation efficiency of the light emitting device can be prevented and output of the light emitting device can be improved.

A pair of positive and negative electrodes may be disposed in the recess in which the semiconductor element to be mounted so that electric connection between the electrodes and the semiconductor element can be established in the recess. Connection between the electrodes in the recess and the electrodes of the semiconductor element can be established by, for example, bonding a pair of positive and negative electrodes exposed on the bottom surface defining the recess and the electrodes of the semiconductor element respectively through a bump and the like, or by connecting the electrode of the upper surface of the semiconductor element with the electrode on the bottom surface defining the recess by an electrically conductive wire. Entire portions of each electrode of the semiconductor element and the electrically conductive wire connected to the electrode in the recess are preferably housed in the recess. That is, the top of the electrically conductive wire is preferably arranged at a lower position than the upper surface of the support member whereon the light emitting element is disposed. With this arrangement, adverse effect from the light transmissive member 107 to the electrically conductive wire decreases, so that deterioration in reliability due to metal fatigue can be prevented.

In a structure where a recess is formed between a light emitting element and another light emitting element as of the light emitting device of the present embodiment, amount of light increases in a region between the light emitting elements, so that the loss of light increases as the light enters the recess. The present invention can be preferably applied to reduce the loss of light in a light emitting device having such a structure. Hereinafter, each constituent member of the light emitting device of the present invention will be described in detail.

(Light Emitting Element)

A semiconductor device having a light emitting element and a protective element arranged on a support member will be illustrated in the present embodiment, but the semiconductor device of the present embodiment is not limited thereto and a semiconductor device having a light receiving element, other protective element (resistance, transistor, capacitor, or the like), or a combination of at least two kinds of such elements can also be applied. A single or a plurality of protective elements or other semiconductor elements can be housed in the recess. Emission color of the light emitting element may be one of a red region, a green region, or a blue region, or a mixed light color thereof.

In a case where a fluorescent material is concurrently used, it is preferable to use a semiconductor light emitting element having an active layer capable of emitting light with a wavelength capable of exciting the fluorescent material. As an example of such a semiconductor light emitting element, various semiconductors such as ZnSe or GaN can be used. But a nitride semiconductor ($In_xAl_yGa_{1-x-y}N$, $0 \leq X$, $0 \leq Y$, $X+Y \leq 1$) capable of emitting light with a short-wavelength that can sufficiently excite the fluorescent material is preferable. Various emission light wavelengths can be selected depending on the materials or the degree of the mixed crystal in the semiconductor layers.

In a case where a nitride semiconductor is used for the material of the light emitting element, a material such as sapphire, spinel, SiC, Si, ZnO, GaN, or the like, is preferably used as the substrate for semiconductor. It is preferable to use a sapphire substrate in order to form a nitride semiconductor having good crystallinity and which can be efficiently produced in quantity. A nitride semiconductor can be formed on the sapphire substrate in accordance with MOCVD or the like. The substrate for semiconductor can be removed after depositing the semiconductor layers.

In order to emit white light with the light emitting device, it is preferable that the wavelength of light emitted from the light emitting element is in a range from 400 nm to 530 nm, and more preferably in a range from 420 nm to 490 nm, in view of the complementary color relationship with the fluorescent material and deterioration of the sealing resin, or the like. It is further preferable that the wavelength is in a range from 450 nm to 475 nm, in order to improve the excitation and the emission efficiency of the light emitting element and the fluorescent material.

For the material of light emitting element which emits light of red region, a gallium/aluminum/arsenic based semiconductor or a aluminum/indium/gallium/phosphorous based semiconductor is preferably selected.

In addition, in order to obtain a full-color display, it is preferable to use a combination of the light emitting elements each having light-emission wavelength in a range of 610 nm to 700 nm for red region, a range of 495 nm to 565 nm for green region, and a range of 430 nm to 490 nm for blue region.

After fixing the light emitting element on the support member, each of the electrodes of the light emitting element and the electrically conductive wirings of the support member are connected by the electrically conductive wires respectively. The bonding material for fixing the light emitting element is not particularly limited and an insulating adhesive such as epoxy resin, an eutectic material containing Au and Sn, a brazing filler material made of a metal with low melting point or the like, an electrically conductive paste made of a resin or a glass containing an electrically conductive material, or the like, can be used. Here, the electrically conductive material contained in the electrically conductive paste is preferably Au, Sn or Ag, and more preferably an Ag paste with 80% to 90% Ag content. With this, a light emitting device having excellent heat dissipation properties can be obtained. In addition, the semiconductor element having an electrode on its bottom surface side can be bonded to the support member by an electrically conductive paste containing a metal material such as silver, gold, palladium.

In a case where the light emitting element is formed by stacking nitride semiconductor layers on light transmissive sapphire substrate, for example, epoxy resin, silicone resin and the like can be used as the bonding material. At this time, a metal material such as silver or aluminum may be disposed on the bottom surface (That is, a surface on the sapphire substrate which is opposite side of the surface on which the nitride semiconductor layers are stacked. This applies hereinafter in this paragraph). For example, a metal layer can be disposed on the bottom surface of the light emitting element by way of vapor deposition or sputtering, using a metal material such as silver or aluminum. With this arrangement, optical reflectivity of the bottom surface of the light emitting element can be improved, so that deterioration of the resin due to light and heat generated from the light emitting element can be suppressed when a resin is used as the bonding material, and light extraction efficiency of the light emitting device can be improved. Further, from the bottom surface side of the light emitting element, a metal layer made of a material such as silver or aluminum, and then, a eutectic layer made of a material such as Au or Sn are stacked in sequence. With this arrangement, the optical reflectivity between the bottom surface of the light emitting element and the eutectic layer can be improved. In addition, in a case where the eutectic material contains a material which absorbs at least apart of light from the light emitting element, loss of light at the bottom surface side of the light emitting element can be reduced, so that the light extraction efficiency of the light emitting device can be improved.

The light emitting element is fixed by a bonding material on the mounting portion for light emitting element provided on the upper surface of the support member hereinafter described. In the present embodiment, the light emitting element is fixed on the metal member provided on the upper surface of the support member. But it is not limited thereby, and the light emitting element can be mounted on the insulating member forming the support member.

(Electrically Conductive Wire)

For the electrically conductive wire, good properties for ohmic contact, mechanical connectivity as well as electric and thermal conductivity are needed. For thermal conductivity, 0.01 cal/(s)(cm$^2$)($°$ C./cm) or greater is preferable, and 0.5 cal/(s)(cm$^2$)($°$ C./cm) or greater is more preferable. In addition, in view of workability or the like, the diameter of the electrically conductive wire is preferably in a range from $\phi$ 10 µm to $\phi$ 45 µm. In a case where a fluorescent material is contained in the light transmissive member, the electrically conductive wire is likely to break at the interface between the portion which contains the fluorescent material and the portion which does not contain the fluorescent material. For this reason, the diameter of the electrically conductive wire is more preferably greater than or equal to 25 µm. For the reasons of securing the light emitting area and ease of handling, the diameter of the electrically conductive wire is preferably less than or equal to 35 µm. Examples of the electrically conductive wire include gold, copper, platinum, and aluminum wires and their alloy wires.

(Support Member)

The package of the present embodiment includes a support member for arranging the semiconductor element and the electrodes and a light transmissive member for covering the semiconductor element. A planar support member formed with an insulating substrate having a conductive wiring pattern can be suitably used as the support member in the light emitting device of the present embodiment. The light emitting element is disposed on the mounting portion provided on the main surface of the planar support member. In a case of employing a support member which lacks the side walls enclosing the side surface direction of the light emitting element, light emitted from the light emitting element in the side surface direction can be extracted out of the device without loss. The insulating substrate of the present embodiment is rectangular solid in shape having substantially rectangular upper surface. A recess is formed in a substantially center portion of the upper surface such that the recess is extended downwardly from the upper surface side to the bottom surface side. In addition, a metal member for mounting the light emitting element and two pairs of positive and negative electrodes are disposed on the upper surface of the insulating substrate. The recess is formed between the electrodes and the metal material. In addition, electrodes electrically connected to the electrodes disposed on the upper surface of the insulating substrate are disposed on the bottom surface defining the recess. The shape and position of the metal member disposed on the insulating substrate are suitably adjusted in view of the size and shape of the semiconductor element to be disposed on the metal member as the mounting portion, and easiness of applying the electrically conductive wire.

The insulating substrate constructing the support member of the present embodiment defines a recess, which is extending downwardly from the upper surface side to the bottom surface side, in the upper surface of the insulating substrate on which the semiconductor element to be mounted, in a region located outside of the region where the light emitting element to be mounted. A semiconductor element, e.g., a protective element, which is different than the light emitting element is housed in the recess. The outline shape of the opening of the recess according to the present embodiment is substantially square in plan view, but it is not limited thereto, the shape and size thereof can be adjusted corresponding to the size, number and shape of the semiconductor element to be housed in the recess. Similarly, the depth of the recess can be suitably adjusted corresponding to the height of the semiconductor element to be housed and the connection with the electrodes in the recess. As shown in FIG. 1, the recess 103 is preferably defined at substantially a center of the support member 108 between the mounting portion 104b of the first light emitting element 101a and the mounting portion 101b of the second light emitting electrode. With this arrangement, adverse effect on the distribution of light caused by the recess in the support member can be suppressed in the light emitting device of the present embodiment, compared with the light emitting device defining a recess at a corner of the support body (for example, a light emitting device in which the support member is provided with a mounting portion of the first light emitting element, the mounting portion of the second light emitting element, and the recess, arranged thereon in this order in top view).

For example, in a case where the hollow portion is provided simultaneously with the light transmissive member, the size and depth of the recess are preferably such that, for example, the outline shape of the opening of the recess in plan view and the outline shape of the semiconductor element housed in the recess in plan view, which are of substantially similar shape, are preferably in a ratio of 1.0 to 2.5, and that the outline shape of the opening of the recess in plan view and the outline shape of the semiconductor housed in the recess in plan view, which are of substantially similar shape, are in a ratio of 1.0 to 2.5, and the depth of the recess and the height of the semiconductor element housed in the recess are in a ratio of 1.0 to 2.14. If the size of the recess is too large with respect to the size of the semiconductor element, the air bubble which leads to the hollow portion is also large. When such an air bubble is thermally expanded by the heat of the light emitting element, reliability and/or optical properties of the light emitting device may decrease.

A glass epoxy resin made of epoxy resin containing a glass component, a substrate made of ceramics material can be used suitably as the material of the insulating substrate.

In a case where a light emitting device with high contrast is required, a pigment such as $Cr_2O_3$, $MnO_2$, or $Fe_2O_3$ is preferably contained in a base material of the insulating substrate to provide a dark insulating substrate. In a case where high optical reflectivity to be provided to the insulating substrate, a white pigment such as titanium oxide is preferably contained.

Particularly, if high heat resistance or high weather resistance is required, ceramics is preferably used as the base material of the insulating substrate. Alumina, aluminum nitride, mullite and so on are preferable as a main material of ceramic substrate. A sintering agent is added to such a main material and then sintering is carried out to obtain a ceramics substrate. Examples of such ceramics include, ceramic obtained by sintering a raw material power which contains 90 to 96% by weight of alumina and 4 to 10% weight of talc, magnesia, calcia, silica or the like as a sintering agent added thereto at temperature in a range from 1500 to 1700° C., and ceramic obtained by sintering a raw material power which contains 40 to 60% by weight of alumina and 60 to 40% weight of borosilicate glass, cordierite, forsterite, mulite or the like as a sintering agent added thereto at temperature in a range from 800 to 1200° C. Such a ceramics substrate can have various shapes in a green sheet stage before firing. Accordingly, the insulating substrate defining a recess as in the present embodiment can be formed easily. A conductive wiring of various pattern shapes can be provided in the green sheet stage prior to firing. For example, a conductive wiring or an underlayer of a material for mounting portion of the semiconductor element can be formed by way of screen printing of a material paste containing tungsten. After firing the material of the ceramics, a metal material is disposed on the underlayer by way of plating or sputtering using a material such as silver, gold or aluminum, as the top surface thereof. The top surface is preferably covered by a metal material having a high reflectivity against light emitted from the light emitting element.

(Light Transmissive Member)

The material of the light transmissive member is not specifically limited and a light transmissive resin having excellent properties for withstanding the weather, such as silicon resin, epoxy resin, urea resin, fluorine resin, or a hybrid resin containing at least one of the resins, or the like, can be used. In addition, the light transmissive member is not limited to an organic material and an inorganic material having excellent light resistance such as glass or silica gel can also be used. In addition, to the light transmissive member of the present embodiment, any other materials such as a thickening agent, a light diffusion agent, a pigment, a fluorescent material can be added as usage. For example, a colorant can be added according to the emission color of the light emitting device. In addition, examples of the diffusing agent include barium titanate, titanium oxide, aluminum oxide, silicon dioxide, calcium carbonate, and a mixture including at least one of these materials. Further, the light transmissive member can obtain a lens property by making the emission face side of the light transmissive member into a desired form. For instance, the light transmissive member may be shaped as a sheet, a convex lens or a concave lens, and further, an elliptic shape or some combination of these shapes when viewed from a light emission observation plane side.

(Fluorescent Material)

In the light emitting device of the present embodiment, a fluorescent material may be contained in the light transmissive member. As an example of such a fluorescent material, a fluorescent material containing a rare earth element will be described below.

Specific examples thereof include a garnet type fluorescent material including at least one element selected from the group consisting of Y, Lu, Sc, La, Gd, Tb and Sm, and at least one element selected from the group consisting of Al, Ga and In. Specifically, an aluminum-garnet fluorescent material contains Al and at least one element selected from Y, Lu, Sc, La, Gd, Tb, Eu, Ga, and Sm, and is activated with at least one element selected from the rare earth elements. The fluorescent material is excited by visible light or ultraviolet rays emitted from the light emitting element and emits light. Examples of such fluorescent material include, in addition to an yttrium-aluminum oxide fluorescent material (YAG system fluorescent material), $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$, or the like. Among them, more than two kinds of yttrium-aluminum fluorescent materials of different compositions, each containing Y and activated with Ce or Pr can be used in the present embodiment.

In addition, a nitride system fluorescent material contains N, at least one element selected from Be, Mg, Ca, Sr, Ba, and Zn, and at least one element selected from C, Si, Ge, Sn, Ti, Zr and Hf, and activated with at least one element selected from the rare earth elements. Examples of nitride system phosphors include $(Sr_{0.97}Eu_{0.03})_2Si_5N_8$, $(Ca_{0.985}Eu_{0.015})_2Si_5N_8$, $(Sr_{0.679}Ca_{0.291}Eu_{0.03})_2Si_5N_8$, or the like.

EXAMPLES

The following examples further illustrate the present invention in detail but are not to be construed to limit the scope thereof.

Example 1

FIG. 1 is a schematic top view of a light emitting device 100 according to the present example. FIG. 2 is a schematic cross-sectional view of the light emitting device 100, taken along line II-II of FIG. 1, and FIG. 3 is a schematic cross-sectional view of the light emitting device 100, taken along line III-III of FIG. 1. FIG. 4 is a schematic bottom plan view of a light emitting device 100 according to the present example. FIG. 5 is a schematic perspective view of a light emitting device 100 according to the present example.

As shown in FIG. 1, the light emitting device 100 of the present example includes the planar support member 108 having the first electrode 104a and the second electrode 104c supplying electric power to the light emitting element, a plurality of light emitting elements 101a, 101b disposed on the metal member 104b which is the mounting portion thereof and disposed on the support member, the second electrically conductive wires 106 connecting the electrodes of the first light emitting element 101a and second light emitting element 101b with the first electrode 104a and second electrode 104c respectively, and the light transmissive member 107 covering the light emitting elements 101a, 101b and the second electrically conductive wires 106.

The light emitting elements of the present example are two LED chips 101a, 101b made of a nitride system compound semiconductor and emits light of blue region. These LED chips have an upper surface having a rectangular outline shape of 500 μm×290 μm in plan view, and an eutectic material containing Au and Sn as its material is disposed on the bottom surface side of the chip, respectively. The LED chips are respectively bonded to the mounting portion whose top surface is made of silver and provided on the upper surface of the support member by a eutectic material.

The support member has a structure in which tungsten is provided as an underlayer on an insulating substrate made of ceramics and nickel and gold and silver are plated in this order on the underlayer. Each of the electrode and metal members 104b is formed by disposing these metal materials. Further, the support member 108 defines a recess 103 in the upper surface of the insulating substrate, the recess 103 is opening into a region between two mounting portions of the LED chips 101a and 101b. A protective element 102 configured to protect the LED chips 101a, 101b from overvoltage is housed in the recess 103. Further, the light emitting device of the present example defines a hollow portion 111 between the lower surface of the light transmissive member 107 covering the opening of the recess 103 and the upper surface of the protective element 102 housed in the recess 103.

The protective element 102 of the present example is a Zener diode having electrodes of different polarity on its upper surface and the bottom surface respectively. The protective element 102 is bonded on the bottom surface defining the recess 103 by using a silver paste as the electrically conductive adhesive, and the electrode at the bottom surface side is connected with a conductive wiring exposed at the bottom surface defining the recess 103 through the electrically conductive adhesive. The electrode on the upper surface of the protective element 102 is connected to the first electrode 104a disposed on the upper surface of the support member via the first electrically conductive wire 105.

As shown in FIG. 1, the support member 108 of the present example includes a pair of positive and negative electrodes (first electrode 104a and second electrode 104c) connecting to the light emitting element via the second electrically conductive wire 106 on the upper surface of the support member 108 where the light emitting element to be disposed. The support member also includes a metal member 104b insulated from the electrodes, on the upper surface of the support member. The two LED chips 101a, 101b are mounted on the metal member 104b provided separately from the electrodes. With this arrangement, a heat dissipation path can be provided on the support member separately from the arrange pattern of the conductive wiring to be connected with the electrode. Therefore, the light emitting device having high heat dissipation performance can be obtained.

As shown in FIG. 4, in the light emitting device 100 of the present embodiment, a cutout portion is defined in each of a pair of opposite side surfaces of the support member 108 in the longitudinal direction, and a first electrode for external connection 110a and a second electrode for external connection 110c are extendedly provided from the inner surface defining the cutout portions toward the center portion of the support member 108 respectively. The first electrode for external connection 110a and the second electrode for external connection 110c are electrically connected with the first electrode 104a and the second electrode 104c disposed on the support member 108 so as to be connected with each light emitting element, and the electrode disposed at the bottom surface defining the recess 103. That is, the first electrode for external connection 110a and the second electrode for external connection 110c are electrically connected with the first electrode 104a and the second electrode 104c respectively via the conductive wirings enclosed in the support member. At the time when the light emitting device 100 is soldered to an external wiring substrate, the first electrode for external connection 110a and the second electrode for external connection 110c are connected to the wiring substrate through the solder.

As shown in FIG. 2 and FIG. 3, the hollow portion 111 of the present example is defined in the step of disposing the light transmissive member 107 of the light emitting device 100 of the present example, resulted from a residual air bubble in the recess 103. That is, after each semiconductor element is disposed on the support member 108 and respective electrodes are connected thereto via respective electrically conductive wires, a silicone resin containing a YAG system fluorescent material is printed so as to cover the light emitting element, electrically conductive wires, and the opening of the recess. Thus, the hollow portion is defined. The method of manufacturing the light emitting device of the present example is generally as follows.

Firstly, a plurality of LED chips are arranged on an aggregate substrate of the support members 108, in each of which ceramics is used as the material of the insulating substrate, then, a protective element 103 is housed in the recess and electrically connected by electrically conductive wires. Herein, the protective element 103 is bonded with the conductive wiring disposed on the bottom surface defining the recess by a silver paste as an adhesive. The electrode on the bottom surface of the protective element 103 is electrically connected with the conductive wiring through the silver paste.

Next, a silicone resin containing a YAG system fluorescent material is disposed linearly along the arraignment of the LED chips so as to wrap a plurality of LED chips, the electrically conductive wires and the opening of the recesses. Here, the viscosity of the silicone resin containing a YAG system fluorescent material is adjusted to substantially 300 Pa·s. The protective element of the present example has an upper surface whose outline shape is substantially square in plan view, with dimensions 240 μm×240 μm, and a height of substantially 0.14 mm when disposed on the bottom surface defining the recess. In a case where the protective element of such size to be housed in a recess, the opening of the recess is preferably a square of from 0.24 mm to 0.60 mm per side, and the depth from the opening of the recess to the bottom surface is preferably from 0.15 mm to 0.30 mm. In the present example, the opening of the recess is a square of 0.50 mm×0.50 mm, and the depth of the recess is 0.15 mm. Further, after curing the silicone resin, the light transmissive member and the insulating substrate are cut into individual chips with a predetermined size by dicing to obtain the light emitting device 100 of the present example.

Here, each of the marks (linear or L-shaped marks) 109 formed at the four corners or sides of a rectangular upper surface of the support member 108 can serve as an indicator identifying the polarity of a pair of positive and negative electrodes disposed on the light emitting device 100, and also can serve as a mark showing the dicing line at the time of dicing to obtain individual chips.

INDUSTRIAL APPLICABILITY

The present invention can be used for various kinds of light source, such as illumination, various indicators, automobile lamps, displays, liquid crystal backlight.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

The present application is based on Application No. 2007-188709 filed in Japan on Jul. 19, 2007, and No. 2007-335793 filed in Japan on Dec. 27, 2007, the contents of which are incorporated herein by references.

What is claimed is:

1. A light emitting device comprising:
a light emitting element having an electrode;
a package disposing the light emitting element and having an electrode, the package further comprising:
a support member having a mounting portion disposing the light emitting element and a recess housing a semiconductor element different than the light emitting element; and
a light transmissive member disposed on the support member; and
an electrically conductive member connecting the electrode disposed on the package and the electrode on the light emitting element,
wherein the light transmissive member covers at least the light emitting element and an opening of the recess, and
wherein the light transmissive member encloses the opening of the recess to define a hollow portion in the recess.

2. The light emitting device according to claim 1, wherein the hollow portion is provided between the bottom surface of the light transmissive member and the upper surface of the semiconductor element housed in the recess.

3. The light emitting device according to claim 1, wherein the light transmissive member has a convex protrusion protruding from the opening of the recess toward the bottom surface defining the recess.

4. The light emitting device according to claim 1, wherein the recess is formed in a region between a plurality of mounting portions of the light emitting elements, and
the support member has an electrode for external connection approximately directly below of the mounting portion.

5. The light emitting device according to claim 1, wherein an outline shape of the opening of the recess in plan view and an outline shape of the semiconductor element housed in the recess in plan view, which are of substantially similar shape, are in a ratio of 1.0 to 2.5.

6. A method of manufacturing a light emitting device having a light emitting element, a package for arranging the light emitting element, and an electrically conductive member for connecting an electrode disposed on the package and an electrode of the light emitting element, the package including a support member having a mounting portion to arrange the light emitting element and defining a recess to house a semiconductor element which is different than the light emitting element, and a light transmissive member disposed on the support member, the light transmissive member at least covering the light emitting element and the opening of the recess, and a hollow portion being retained in the recess formed in the package, the method comprising:
a first step of forming a support member defining a recess which opens to an upper surface of the support member where the light emitting element is to be mounted,
a second step of housing the semiconductor element such that the upper surface of the semiconductor element is lower than the mounting portion of the light emitting element,
a third step of arranging the light emitting element and the electrically conductive member, and a fourth step of disposing a light transmissive member on the support member so as to cover at least the light emitting element and the opening of the recess and to enclose the opening of the recess to define a hollow portion in the recess.

7. The method of manufacturing the light emitting device according to claim 6, wherein the fourth step includes a step of continuously supplying material of the light transmissive member in substantially parallel direction to the mounting surface of the light emitting element.

8. The method of manufacturing the light emitting device according to claim 7, wherein in the fourth step, the viscosity of the material of the light transmissive member is preferably adjusted based on the size of the recess with respect to the size of the semiconductor element so that an air bubble can be retained in the recess.

9. The method of manufacturing the light emitting device according to claim 8, wherein the viscosity of the light transmissive member is in a range from 200 Pa·s to 500 Pa·s.

10. The method of manufacturing the light emitting device according to claim 7, wherein the material of the light transmissive member contains at least one resin selected from silicone resin or epoxy resin, and the resin contains a particulate fluorescent material.

11. The method of manufacturing the light emitting device according to claim 6, wherein the outline shape of the opening of the recess in plan view and the outline shape of the semiconductor housed in the recess in plan view, which are of substantially similar shape, are in ratio of 1.0 to 2.5, and the depth of the recess and the height of the semiconductor element housed in the recess are in a ratio of 1.0 to 2.14.

* * * * *